United States Patent [19]

Iranmanesh

[11] Patent Number: 5,374,566
[45] Date of Patent: Dec. 20, 1994

[54] METHOD OF FABRICATING A BICMOS STRUCTURE

[75] Inventor: Ali Iranmanesh, Sunnyvale, Calif.

[73] Assignee: National Semiconductor Corporation, Santa Clara, Calif.

[21] Appl. No.: 9,691

[22] Filed: Jan. 27, 1993

[51] Int. Cl.$^5$ .......................................... H01L 21/265
[52] U.S. Cl. .......................................... 437/31; 437/32; 437/59; 437/28; 148/DIG. 9
[58] Field of Search ................ 437/31, 32, 59, 162, 437/28, 57; 148/DIG. 9

[56] References Cited

U.S. PATENT DOCUMENTS

| | | | |
|---|---|---|---|
| 4,006,046 | 2/1977 | Pravin | 148/187 |
| 4,764,480 | 8/1988 | Vora | 437/54 |
| 4,857,476 | 8/1989 | Colinge | 437/33 |
| 5,126,281 | 6/1992 | Carey et al. | 437/161 |
| 5,258,317 | 11/1993 | Lien et al. | 437/32 |

OTHER PUBLICATIONS

Ali A. Iranmanesh, *A 0.8-μm Advanced Single-Poly BiCMOS Technology for High-Density and High-Performance Applications*, IEEE J. of Solid State Circuits, vol. 26, No. 3, Mar. 1991.

Chiu et al., *A Bird's Beak Free Local Oxidation Technology Feasible for VSLI Circuits Fabrication*, IEEE Transactions On Electron Devices, vol. ED-29, No. 4 Apr. 1982.

Claeys et al., *Structural and Electrical Characterization of SWAMI Techniques for Submicron Technologies*, J. Electrochem. Soc., vol. 136, No. 9, Sep. 1989.

Claeys et al., *Structural and Electrical Characterization of SWAMI Techniques for Submicron Technologies*, The Electrochemical Society, Spring Meeting, Extended Abstracts, vol. 88-1, 1988.

Ratnam et al., *The Effect of Isolation Edge Profile on the Leakage and Breakdown Characteristics of Advanced Bipolar Transistors*, IEEE 1992 Bipolar Circuits and Technology Meeting, pp. 117–120.

Tsang et al., *A Two-Step Implanted Base (TSIB) Process for High-Performance Bipolar Transistor*, IEEE Transactions On Electron Devices, 39 No. 9. Sep. 1992.

Ning et al., *Self-Aligned Bipolar Transistors for High-Performance and Low-Power-Delay VLSI*, IEEE Transactions On Electron Devices, ED-28 No. 9, Sep. 1981.

Primary Examiner—Brian Hearn
Assistant Examiner—Tuan Nguyen
Attorney, Agent, or Firm—Townsend and Townsend Khourie and Crew

[57] ABSTRACT

A method of fabricating a bipolar transistor on a semiconductor wafer is provided. The method includes steps of implanting p-type dopants into diffusion compensation regions (23) where an intrinsic base region (18) intersects an isolation oxide (31). The implant step is carried out before depositing a poly layer (from which an emitter contact (27a) is formed). Thus, the diffusion compensation region (23) is also located below the emitter contact (27a). A diffused emitter (27b) is subsequent formed by diffusing dopant from the emitter contact (27a) into the underlying active area.

10 Claims, 17 Drawing Sheets

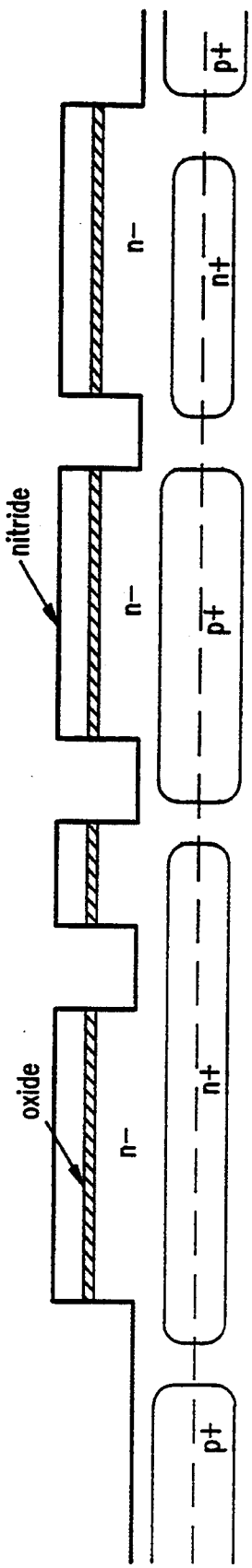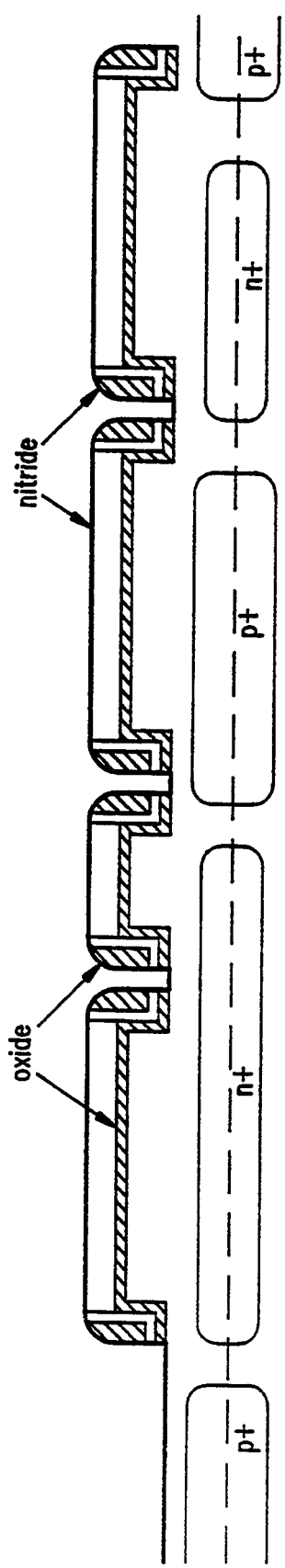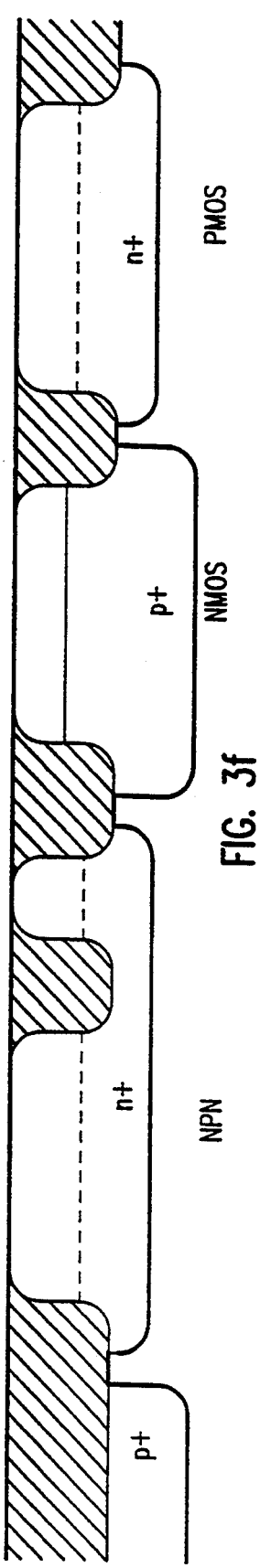

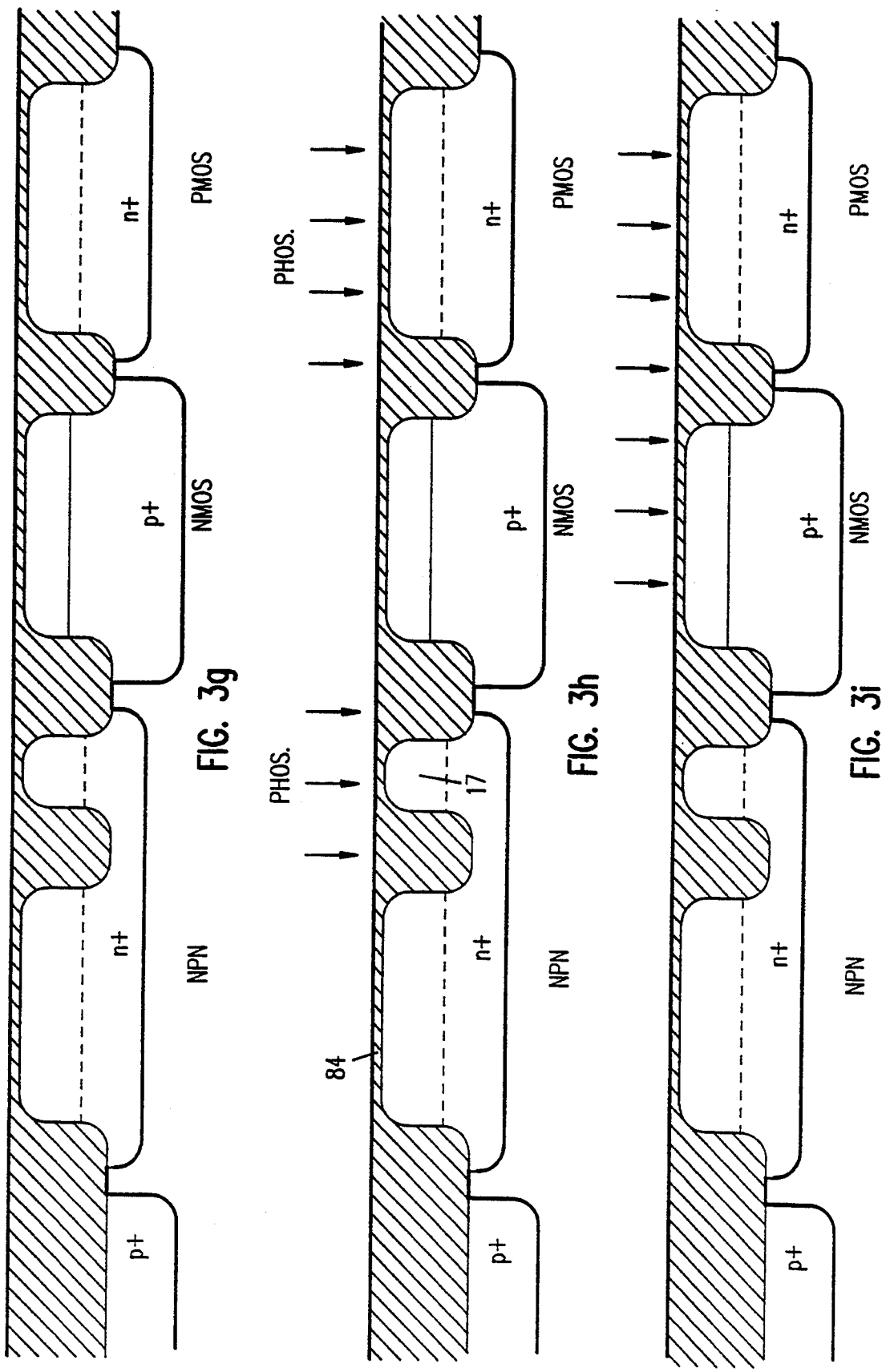

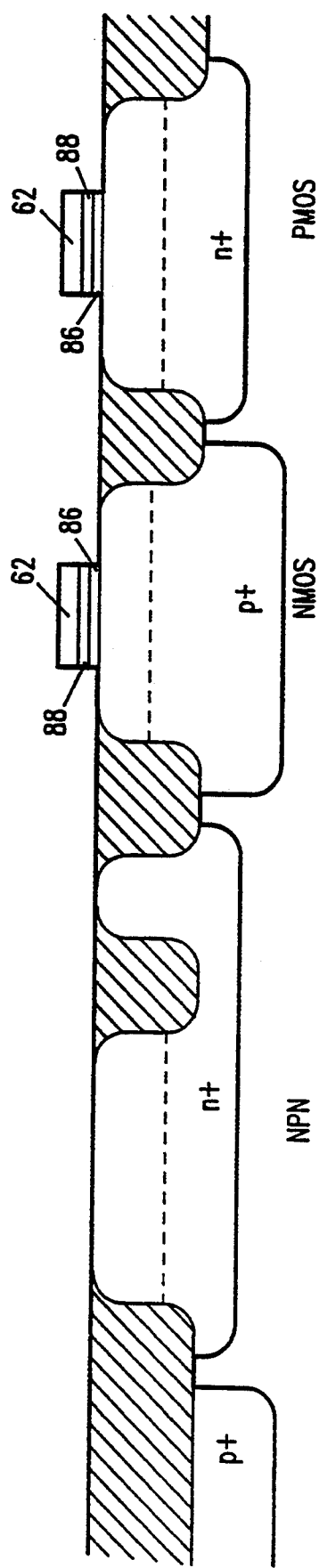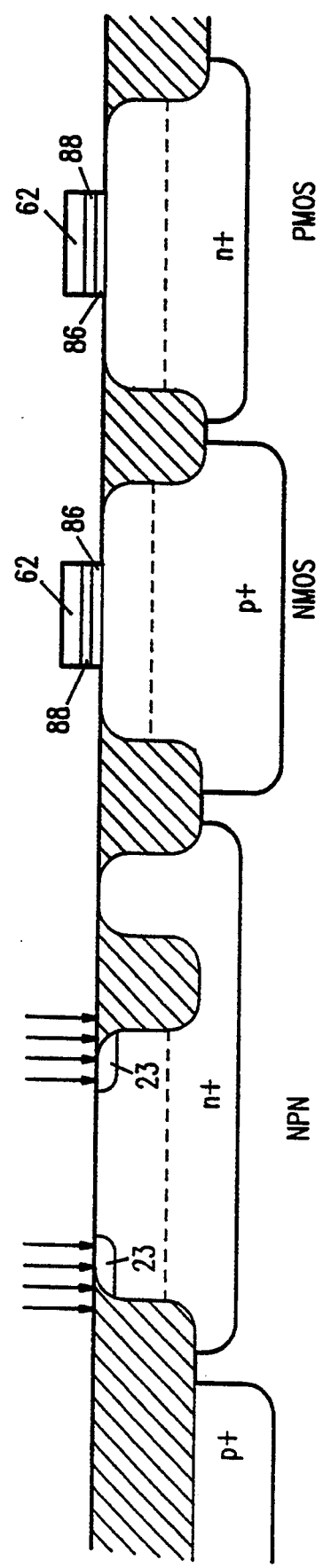

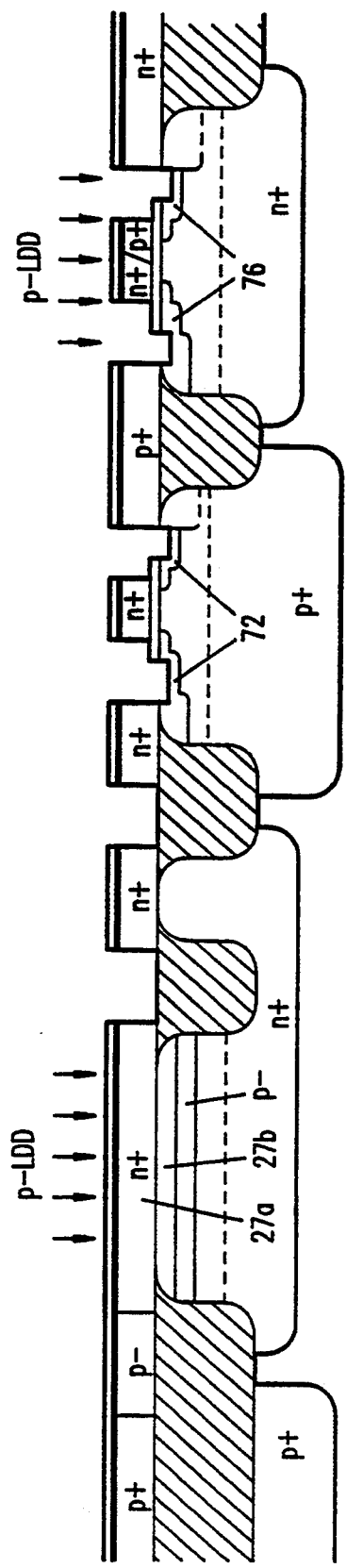
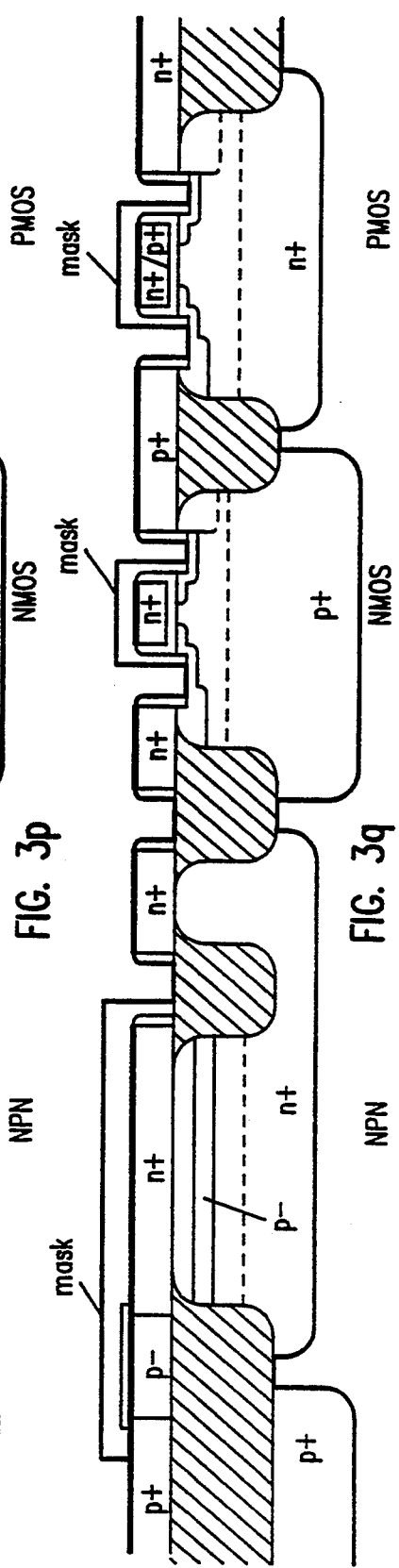
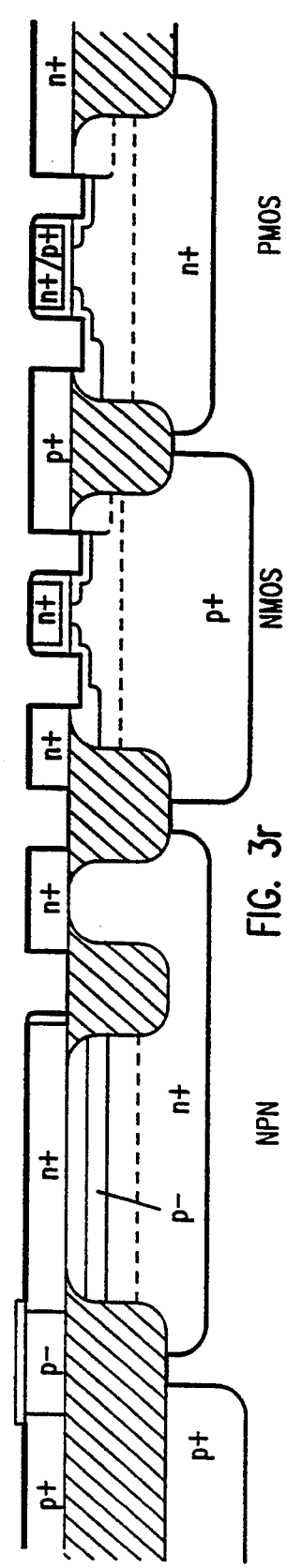

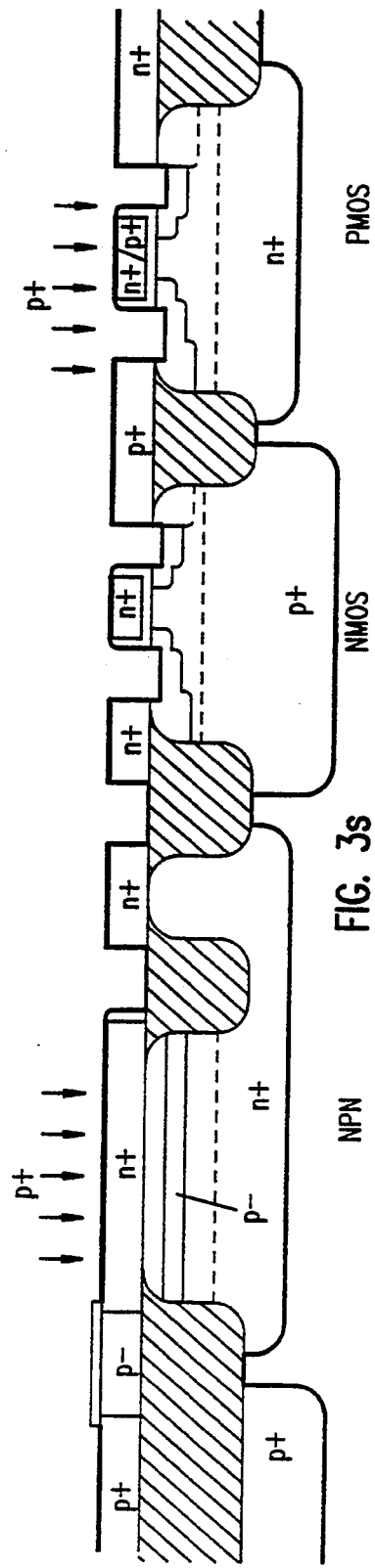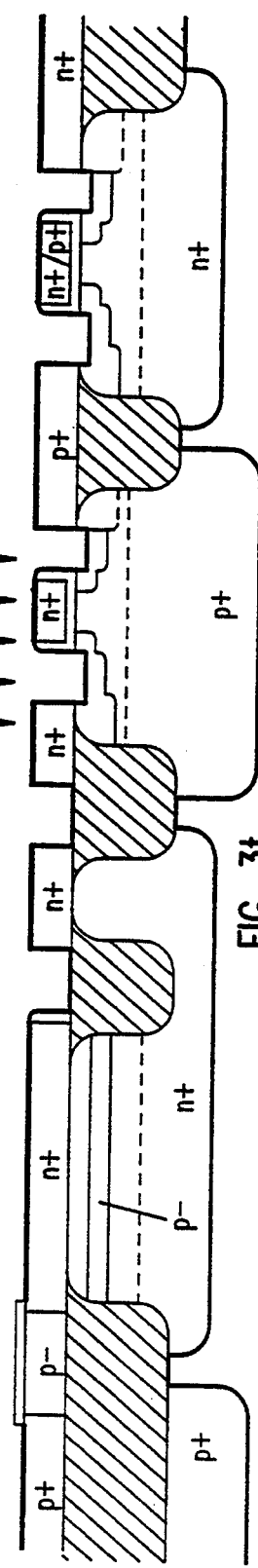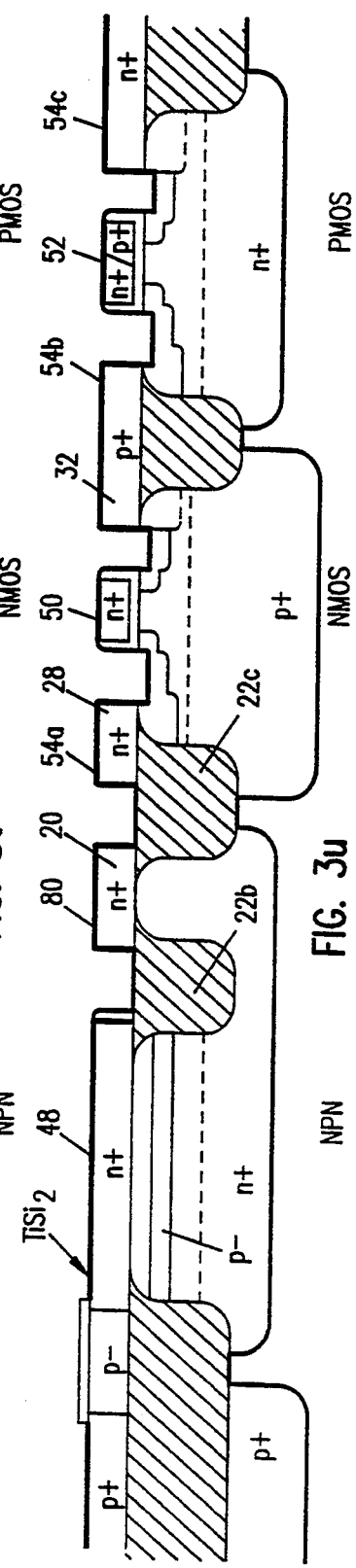

METHOD OF FABRICATING A BICMOS STRUCTURE

BACKGROUND OF THE INVENTION

The present invention relates to the field of semiconductor devices and their manufacture. More specifically, in one embodiment the invention provides bipolar devices on a substrate and a process for their fabrication.

Bipolar semiconductor devices and their methods of manufacture are well known. Such devices are described in, for example, U.S. Pat. No. 4,609,568 (Koh et al.) and U.S. Pat. No. 4,764,480 (Vora), both assigned to the assignee of the present invention and incorporated herein by reference for all purposes.

Recently, the advantages of bipolar and CMOS devices have been beneficially incorporated into circuits using both types of devices on a single substrate. Circuits which incorporate both bipolar and CMOS devices have come to be known as "BiCMOS." BiCMOS devices offer the advantages of the high packing density and low power consumption of CMOS devices, as well as the high speed of bipolar devices. One BiCMOS device and process for fabrication thereof is described in U.S. Pat. No. 4,764,480.

Isolation of bipolar junction transistors ("BJTs") is an important step in bipolar and BiCMOS fabrication. One well-known isolation method is the so called side-walled-masked-isolation (SWAMI) process. BJTs fabricated according to this and some related processes may have a "walled emitter" in which the emitter of the transistor intersects the isolation oxide. Walled emitter devices make effective use of the device active area, minimizing the parasitic collector-base capacitance for a given emitter area. Further, transistors with walled emitters generally require reduced amounts of layout area per transistor. For comparison, in a non-walled emitter BJT, the emitter is separated from the isolation oxide, and the resultant structure has a generally uniform emitter-base edge profile on all edges. This type of transistor usually requires more layout area for a given lithography technique than a walled emitter BJT.

Walled emitters can have certain problems, among which are excessive collector-emitter leakage currents ("$I_{CEO}$") and lower the collector-emitter breakdown voltage, $BV_{CEO}$. $I_{CEO}$ is a current that flows between the collector and emitter when a voltage is placed between the collector and emitter while the base terminal is left open. Substantial leakage currents can reduce yield and/or cause improper circuit operation.

$I_{CEO}$ can be excessive due to a number of factors. Some of these are mediated by excessive isolation oxide encroachment at the corners of the active areas on the BJT. For example, the intrinsic base dopant can segregate into the field oxide adjacent the base, leading to locally lower based dopant concentrations. This can also allow the subsequently formed emitter region to penetrate further into the intrinsic base region, resulting in a reduced base width. Both effects (reduced base width and lower base dopant concentration) can lead to excessive leakage current between the emitter and the collector at the intersection of the intrinsic base and the isolation oxide. In addition, charges present in the field oxide as a result of dopant segregation can cause an inversion of the P-type intrinsic base region at the edge of the walled emitter, creating a leakage path between the collector and emitter.

One recently developed method for off-setting the above problems involves forming diffusion compensation regions in the areas where the base width narrowing occurs. The diffusion compensation regions contain elevated concentrations of the base dopant so that the dopant segregation or inversion of the intrinsic base region is avoided. Typically the diffusion compensation regions are formed by implanting and diffusing base dopant into the isolation oxide regions before the isolation oxide is grown. Devices formed according to this process are described in U.S. patent application Ser. No. 07/821,256 which is incorporated herein by reference for all purposes.

Other methods for reducing or controlling $I_{CEO}$ leakage in walled emitters have generally tended to reduce the performance of the BJTs. For example, increasing the base width or increasing the dopant concentration throughout the base region reduce the performance of the BJT by increasing the transit time of charges in the base region and by increasing the parasitic capacitances of the BJTs.

From the above it is seen that an improved method for controlling $I_{CEO}$ currents in a BJT having a walled emitter (particularly for use in BiCMOS devices) is desired to provide devices with improved performance.

SUMMARY OF THE INVENTION

A method for improving the performance of a walled emitter BJT is described herein. The method involves implanting boron or another p-type dopant selectively at the intersection of the isolation oxide and the emitter-base region, near the "bird's beak." This step is carried out prior to deposition of a poly layer that ultimately forms the emitter contact. In preferred embodiments, the method of this invention includes, in addition to conventional bipolar or BiCMOS fabrication steps, three steps: a masking step, an implanting step, and an annealing step. Preferably, these steps are performed before a gate oxide wet etch and after a poly deposition step in a BiCMOS fabrication.

This selective incorporation of boron has several benefits. The boron compensates for intrinsic base boron segregation during field oxidation, reducing the propensity towards inversion in the area near the field oxide. The boron also compensates for oxide charge in the field oxide which, if unchecked, could cause or contribute to the inversion of the p-type base region. It accomplishes these results without affecting the bulk of the active intrinsic base.

By compensating for both the intrinsic base boron segregation and the oxide charges, the desired base width can be maintained at the emitter-isolation edge and the $I_{CEO}$ can be reduced. The reduction of the $I_{CEO}$ increases noise margins, thereby improving the signal-to-noise ratio.

This technique has several advantages over the known art. The boron results in only small increases in the parasitic capacitance of the device, which preserves the desired BJT performance, particularly the BJT's base transit time. The boron implantation also requires a minimal increase in the complexity of the manufacturing process, and can be easily integrated into standard isolation processes such as those described in, Peltzer, U.S. Pat. No. 3,648,125, which is incorporated herein by reference for all purposes.

In one embodiment, the present invention provides a method including the following steps. First, an active area (including intrinsic base and emitter regions) is defined on a semiconductor substrate. Subsequently, an isolation oxide is formed around the active area such that an intersection region between the isolation oxide and the base region is formed. Leakage currents are most likely to be excessive at this intersection between the active area and the isolation oxide. The intersection region typically underlies a region defining the location of an emitter contact to be formed later in the process.

After the isolation oxide has been prepared, a diffusion compensation region is formed at the intersection region. Typically, the diffusion compensation region is formed by masking the active area and implanting dopants at the intersection of the isolation oxide and the active area. In the case of an NPN type transistor, the diffusion compensation region will have an increased concentration of P type dopants. In preferred embodiments, the diffusion compensation region will be formed by implanting boron or $BF_2$ at between about 20 and 60 KeV at doses of between about $10^{10}$ and $10^{15}$. In most preferred embodiments, the implant will be made at about 25 KeV to a dose of about $2 \times 10^{13}$. Subsequently, the boron implant is preferably annealed for about one to three hours at between about 600 and 1000 degrees Centigrade, and preferably for about two hours at 800 degrees Centigrade.

After the diffusion compensation region has been formed, the remainder of the fabrication takes place according to conventional procedures. For example, a layer of poly may be formed over the substrate including the bipolar active area and isolation oxide. From this poly layer, an emitter contact is formed over the diffusion compensation regions. Dopants are subsequently diffused from the emitter contact into the underlying base region to form an emitter.

A further understanding of the nature and advantages of the invention herein may be realized by reference to the remaining portions of the specification and the attached drawings.

DESCRIPTION OF THE PREFERRED EMBODIMENTS

CONTENTS

Figure 1A:
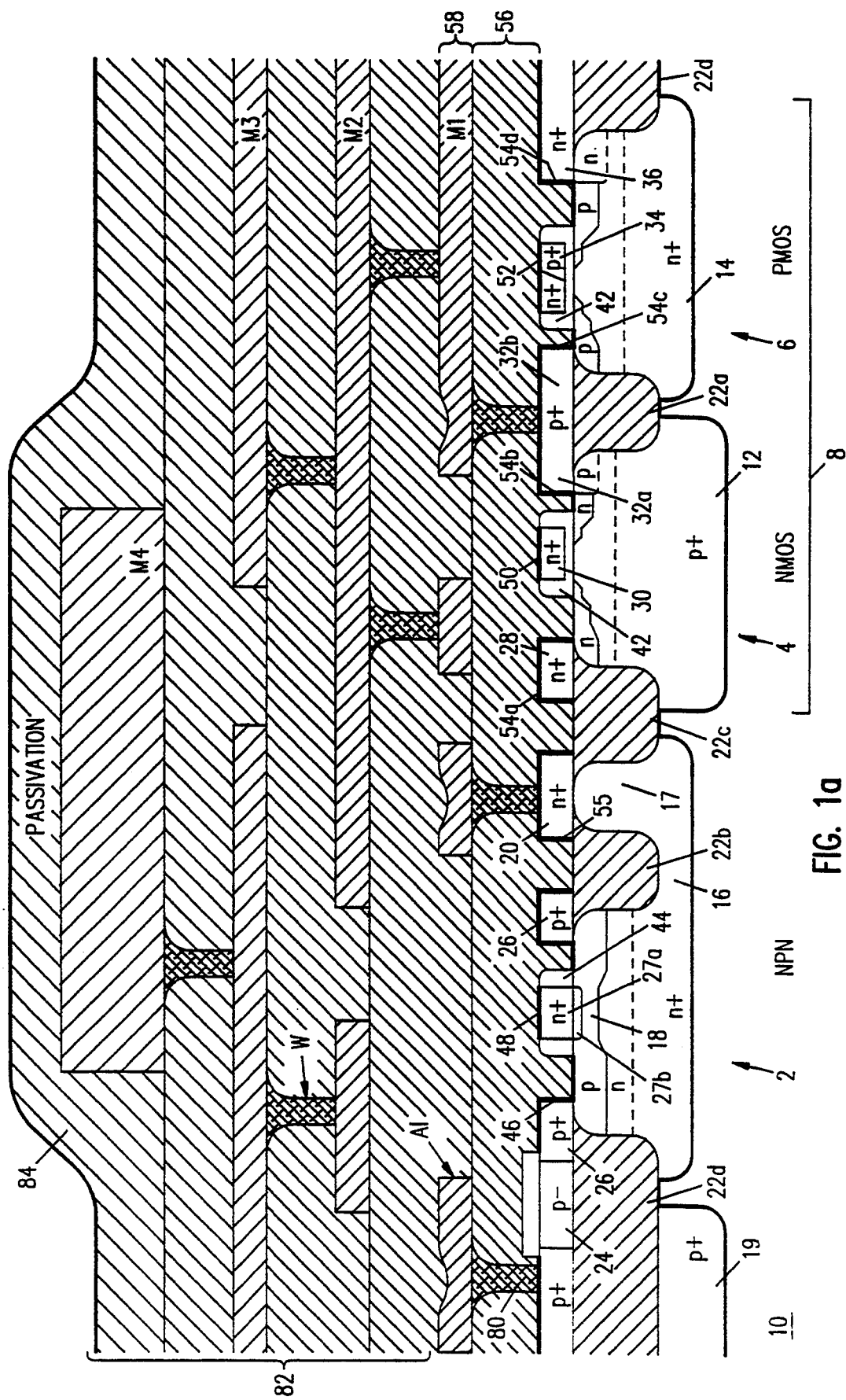
FIG. 1a and 1b are cross-sections of a BiCMOS and bipolar structure according to one embodiment of the invention.
Figure 1B:
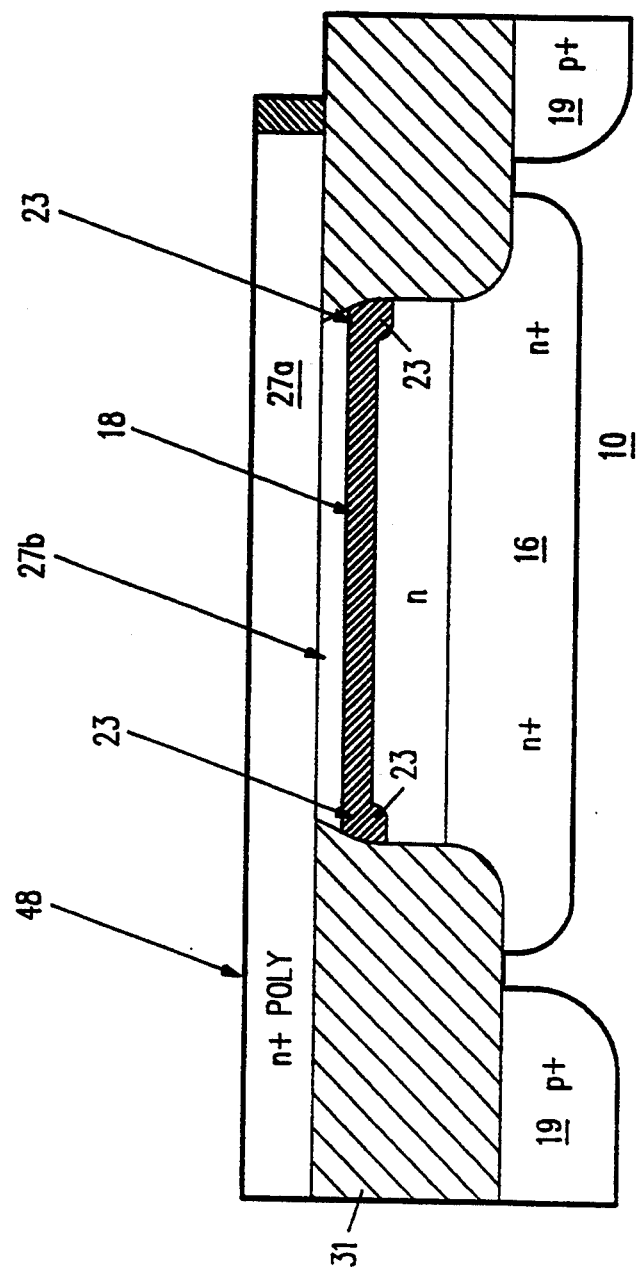

I. General
II. Fabrication Sequence of BiCMOS Devices
III. Device Performance
IV. Conclusion I. General FIG. 1a illustrates a BiCMOS device in cross-section according to one embodiment of the invention. Although the device shown includes a CMOS structure, the bipolar devices of the present invention can be fabricated independently and need not form part of a BiC-MOS device. In addition, although the embodiment described herein is a silicon based structure, other semiconductors (e.g. germanium or gallium arsenide) could also be used. The cross section shown in FIG. 1b is taken through the emitter contact 27a shown in FIG. 1a in a direction perpendicular thereto.

The device includes a bipolar transistor 2 (which in the embodiment shown in FIG. 1a is a NPN transistor), a n-channel MOSFET (NMOS transistor) 4 and a p-channel MOSFET (PMOS transistor) 6 in the same substrate. The NMOS transistor 4 and the PMOS transistor 6 are appropriately connected to form a CMOS structure 8.

The devices are fabricated on a substrate 10. In the embodiment shown in FIG. 1a, the substrate is a p-substrate having a dopant concentration of between about $1 \times 10^{13}$ and $1 \times 10^{16}/cm^3$ with a preferred range of $2 \times 10^{14}$ and $3 \times 10^{15}/cm^3$. A reduced pressure doped n-type epitaxial silicon is grown on top of the substrate, in which the devices are fabricated.

In most embodiments the NMOS transistor 4 is formed in a p+ tub or p well 12 and the PMOS transistor 6 is formed in an n+ tub or n well 14. In preferred embodiments, the n well 14 is graded and doped to a concentration of between about $1 \times 10^{16}$ and $2 \times 10^{19}/cm^3$ with a preferred concentration of about $2 \times 10^{16}$ to $5 \times 10^{16}/cm^3$. The p well 12 is graded and doped to a general concentration of between about $1 \times 10^{16}$ to $1 \times 10^{18}$ with a preferred range of about $5 \times 10^{16}$ to $7 \times 10^{17}/cm^3$, although a wide range of dopant concentrations may be used without departing from the scope of the invention. Wells 12 and 14 enable the complementary conductivity devices to be formed on a single substrate.

The NPN transistor 2 is provided with a heavily doped buried layer 16 and collector sink 17, which together provide a low resistance connection region between a collector contact 20 and the base 18. In preferred embodiments, the buried layer 16 and sink 17 are doped to a concentration of between about $1 \times 10^{17}$ and $1 \times 10^{20}/cm^3$ with a preferred range of about $5 \times 10^{18}$ to $1 \times 10^{20}/cm^3$.

A p+ channel stop 19 is provided between the NPN transistor and adjacent devices to prevent surface inversion of the lightly doped substrate which would connect the buried layer 16 with adjacent devices. Between the NMOS transistor 4 and the PMOS transistor 6, between the sink 17 and the base 18, between the NPN and NMOS transistors, and between the transistors shown in FIG. 1a and adjacent transistors, oxide isolation regions 22a, 22b, 22c, and 22d, respectively, are provided which typically will be, for example, $SiO_2$ for device isolation. Boron implant regions 23 (shown in FIG. 1b only) are located in front of and behind the plane of FIG. 1a and at the intersection of oxide isolation regions and base region 18. The boron implants 23 will not substantially change the dopant concentration of the extrinsic base regions. However, at the edges of the intrinsic base region adjacent to the field oxide regions, the boron implants will substantially compensate for the out-diffusion of boron into the field oxide. In some embodiments, the implant will slightly increase the base width in the region directly adjacent to the field oxide under the emitter contact as shown in FIG. 1b to ensure complete compensation for out-diffusing boron.

Along the surface of the device and formed from a single layer of deposited polycrystalline silicon (polysilicon), are a resistor 24, base contact 26, emitter contact 27a, collector contact 20, NMOS drain contact 28, NMOS gate 30, NMOS source/well tap 32a, PMOS drain 32b, PMOS gate 34, and PMOS source/well tap contact 36. An emitter region 27b is diffused into the monocrystalline epitaxial layer from emitter contact 27a. It is to be recognized that while region 27a is referred to herein as the emitter contact, this region is sometimes referred to by those of skill in the art as an emitter. No difference in meaning is intended.

Thin gate oxide layers are provided beneath the NMOS and PMOS transistor gates, and sidewall oxide 42 is provided on the NMOS and PMOS gates. In some embodiments the NMOS gate is formed of heavily doped implanted n+ polysilicon, while the PMOS gate may be formed from n+ or p+ implanted polysilicon. N-type dopants are preferred in the PMOS gate because n+ will provide a buried channel device, having a higher carrier mobility, while p+ will provide a surface channel device. Sidewall oxide 44 is also provided on the sidewalls of the bipolar emitter contact 27a.

Metallic contacts (i.e., contacts containing metal) such as silicide contacts 46 are formed on the p+ bipolar transistor base contacts 26. The silicide contact covers the upper portion of the base contact, the sidewall of the base contact, as well as the horizontal upper surface of the base region from the sidewall of the base contact up to the sidewall oxide of the emitter. A separate silicide contact 48 is provided along the top portion of the emitter contact 27a between the sidewall spacer oxide regions 44. The refractory metal contacts shown herein reduce the resistivity of the contacts and, therefore, increase the speed of the device.

Similarly, silicide contacts are provided for the poly collector contact 20, the NMOS gate 30, the PMOS gate 34, and p+/n+ source and drain polycrystalline contacts 28, 32, and 36. Like the silicide contact for the emitter contact 27a, the silicide contacts 50 and 52 for the NMOS and PMOS gates, respectively, extend only from sidewall oxide to sidewall oxide. Conversely, the silicide contacts 54a, 54b, 54c, and 54d for the NMOS and PMOS source and drain contacts cover the sidewall of the polysilicon contacts and extend along the horizontal portion of the source/drain up to the sidewall oxide of the gates 30 and 34. The silicide 55 for the collector contact covers the sidewalls of the contact down to field oxide regions 22b and 22c, as well as the upper surface of the collector contact.

The structure further includes a thick (0.8 to 1.3 and preferably about 1.3 μm) oxide layer 56 to insulate the devices from metal layer 58, used for interconnection purposes. Tungsten plugs 80 may optionally be provided to fill the apertures in the oxide layer 56 between the first metal layer and the various silicide regions. Additional metal/oxide interconnect layers 82 may also be provided, topped by a passivation layer 84.

Figure 2:
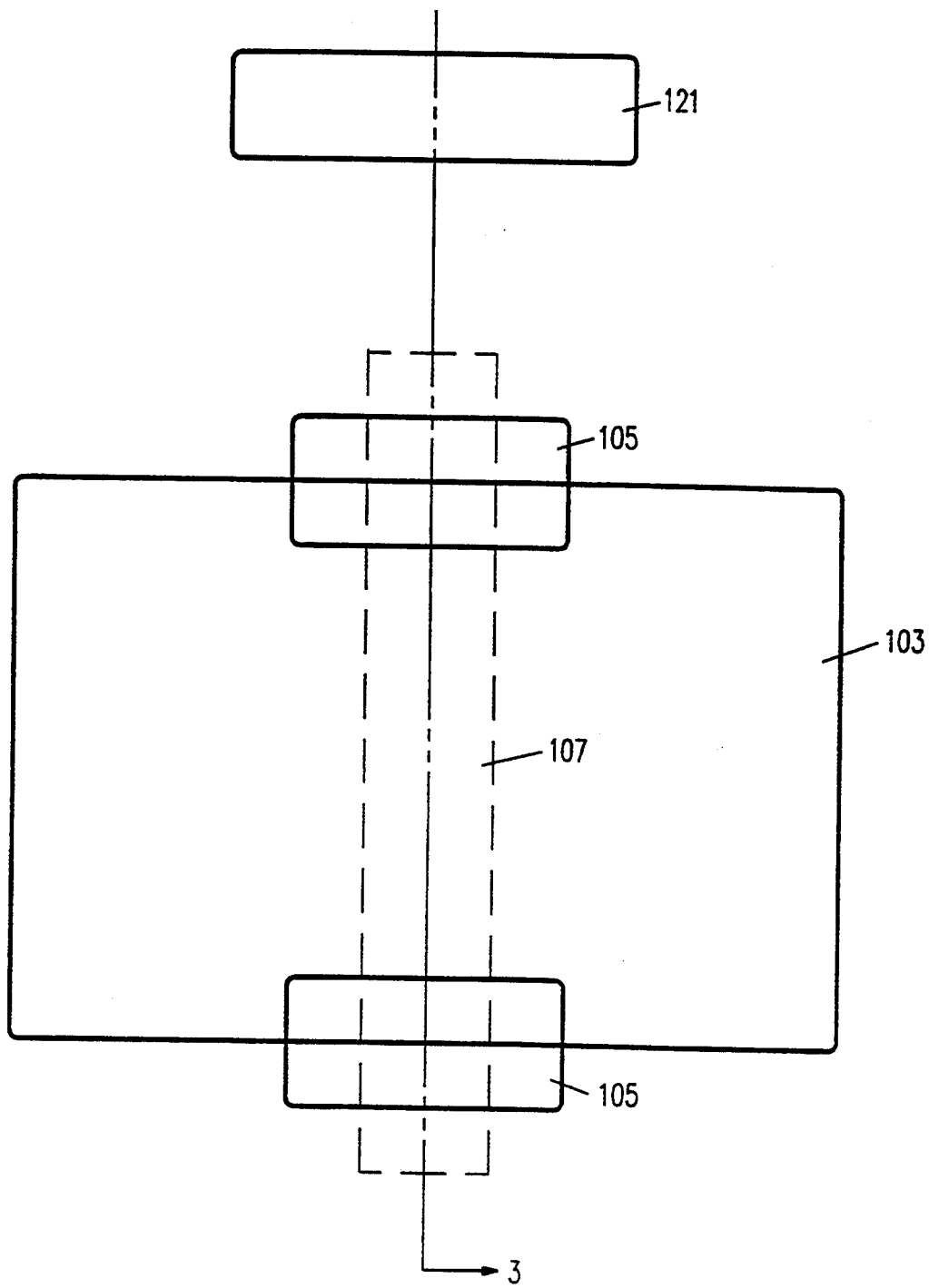
FIG. 2 is a top view of a mask on a partially fabricated structure according to the invention.

FIG. 2 is a top view of a partially fabricated bipolar device emphasizing the boron implant regions used to form diffusion compensation regions 23. The structure includes a mask on top of a base region 103, a collector sink region 121 (on, for example, an epitaxial silicon layer), and a surrounding isolation oxide. The mask blocks boron (or other dopant of the same conductivity type as the base) from penetrating the device except through windows 105. This dopant implant forms diffusion compensation regions 23. The windows 105 can have various sizes and shapes, but should generally expose the intersection regions between the isolation oxide and the active region (i.e. the region where the intrinsic base and emitter are located). The windows should also be small enough so that the implant remains localized near the intersection regions without substantially extending into the active area.

Later in the process, after the diffusion compensation implant has been made, a poly layer will be deposited and an emitter contact formed at region 107. Still later, an emitter will be diffused into part of the base region below the emitter contact. After the fabrication process is complete, a lightly doped intrinsic base region will remain below the emitter. Most leakage current flows at the intersections of the intrinsic base and the isolation oxide. Thus, the diffusion compensation implant compensates this region with extra base dopant before the emitter and emitter contact are formed. Because the leakage current flows primarily in a rather small region, the compensation implant is preferably limited to a similarly small region. Thus, mask windows 105 will typically extend over the base 103 only to a slight degree; for example, 0.2 micrometers for current device sizes.

II. Fabrication Sequence of BiCMOS Devices

Figure 3A:
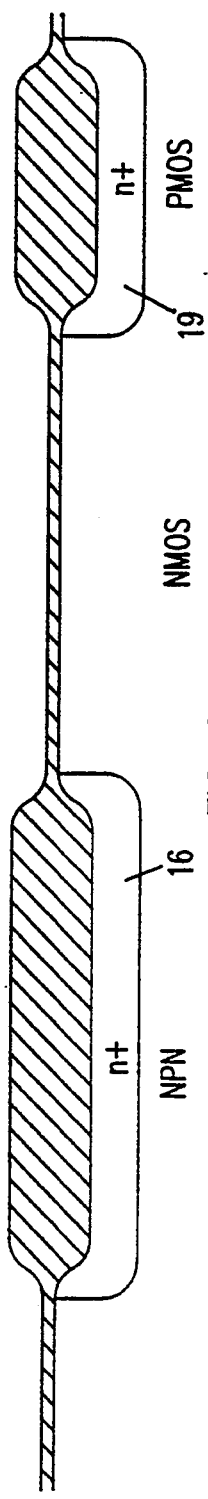
FIGS. 3a to 3w are cross-sections showing fabrication steps of a BiCMOS device according to the present invention.
Figure 3B:
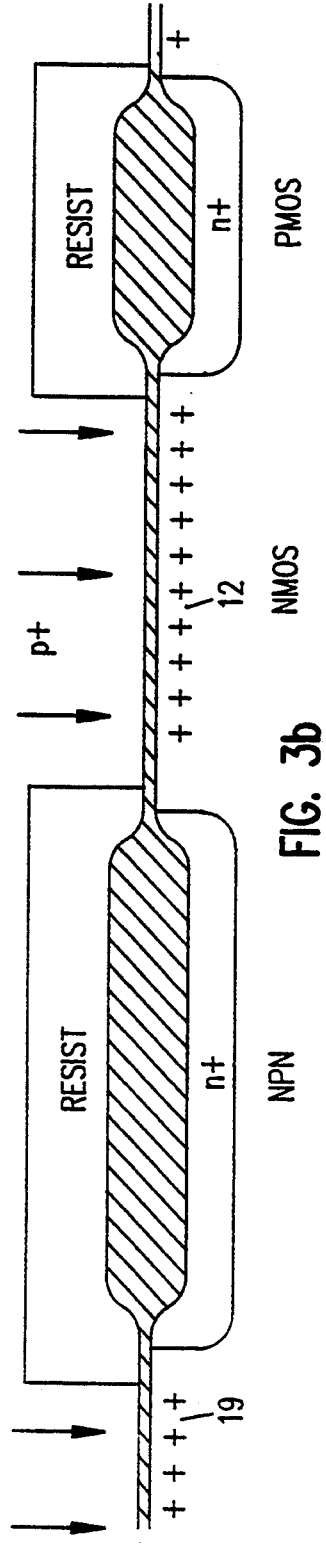
Figure 3C:
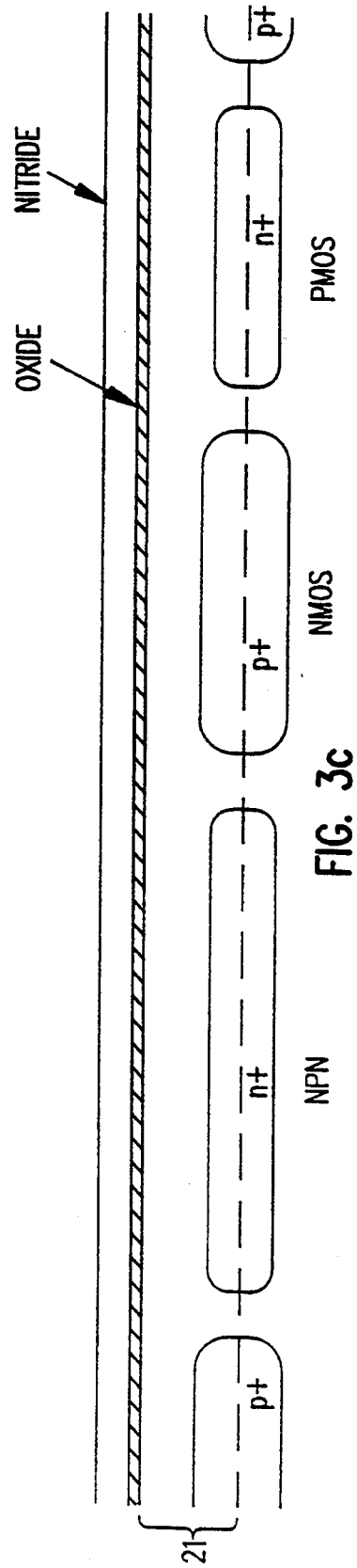
Figure 3L:
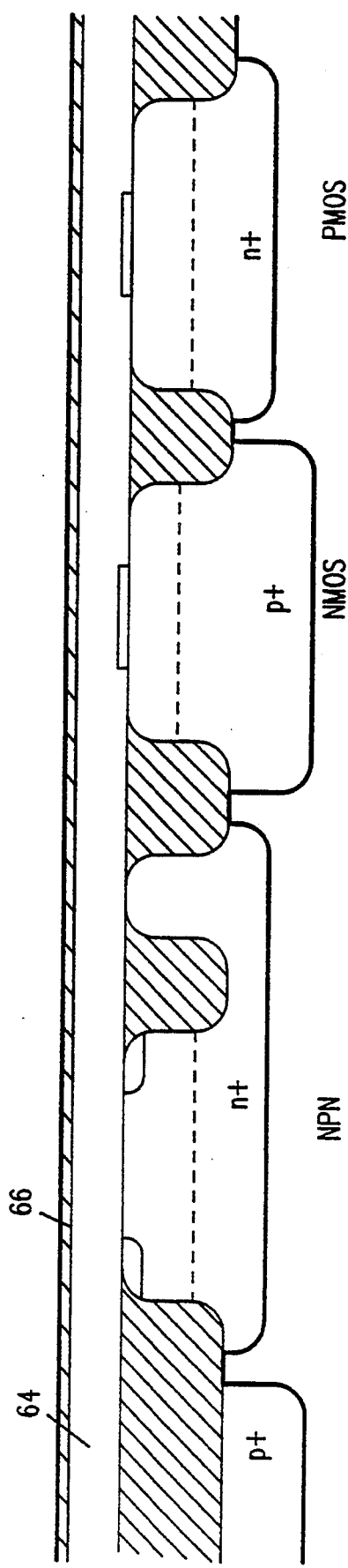
Figure 3M:
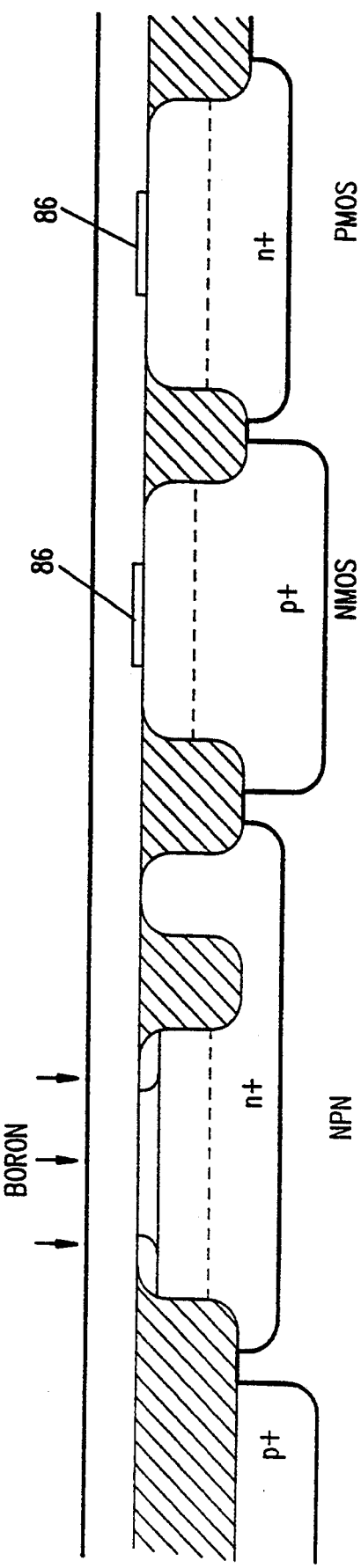
Figure 3N:
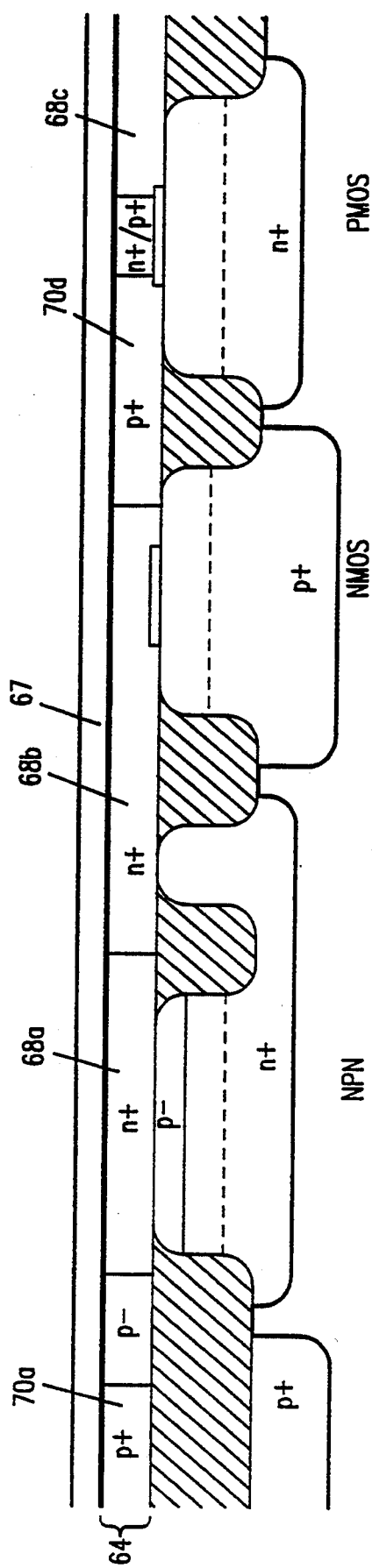
Figure 3O:
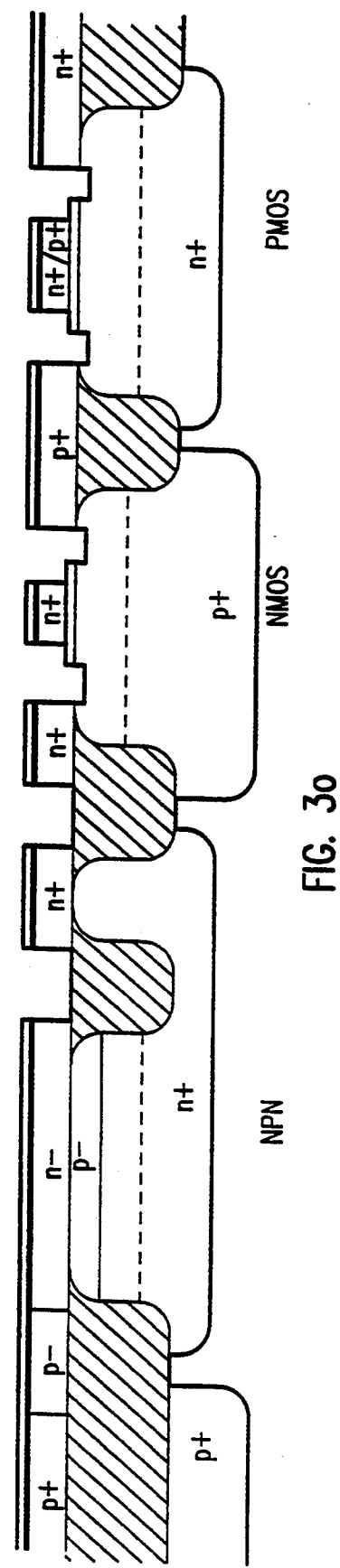
Figure 3V:
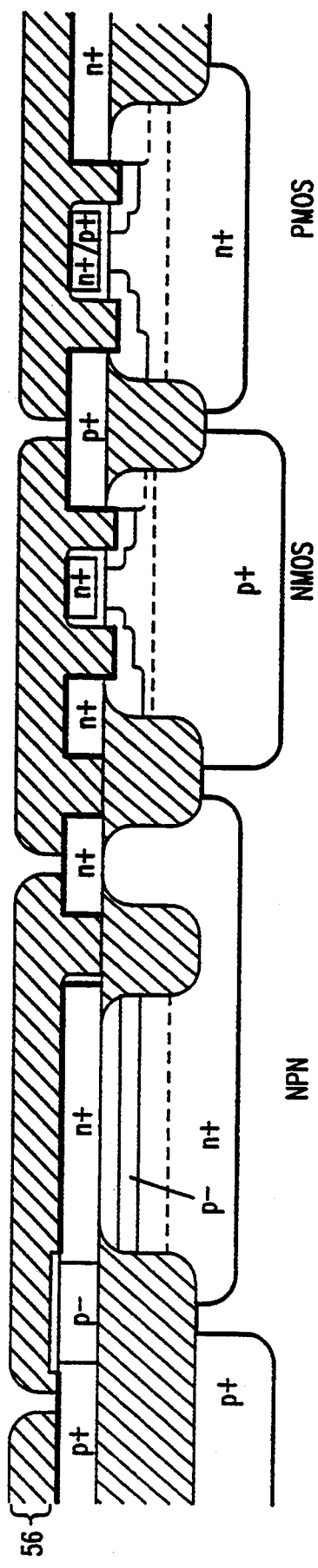
Figure 3W:
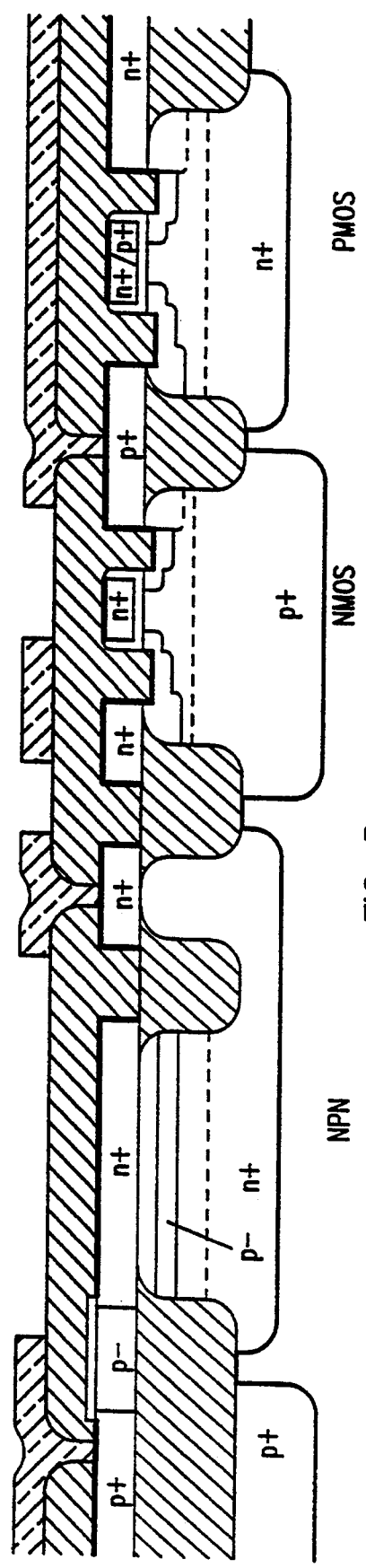

FIGS. 3a through 3w illustrate fabrication of the devices shown in FIGS. 1 and 2. The views in FIGS. 3a through 3w are taken through line 3 passing through windows 105, collector sink 121 and a CMOS device (not shown) in FIG. 2. Thus, the process used to form diffusion compensation regions 23 is illustrated in FIGS. 3.

Although the method is fully described in the context of BiCMOS fabrications, structures containing only bipolar devices (without MOS devices) can be formed. Thus, some steps described below that pertain only to fabricating MOS devices can be excluded if the resulting structure is to contain only bipolar devices.

FIG. 3a illustrates a cross-section of the devices at a first stage of their fabrication. To reach this stage, the substrate was denuded, and a screen oxide layer was formed. The device was then masked for simultaneous implant of the n+ tub or well 14 and the npn buried layer 16 with arsenic, antimony, or the like. The implant energy used for formation of regions 14 and 16 is preferably about 50 to 200 keV with a preferred range of between about 60 to 80 keV such that the dopant concentration of regions 14 and 16 is between about $5 \times 10^{17}$ to $2 \times 10^{20}/cm^3$ with a preferred range of about $1 \times 10^{19}$ and $1 \times 10^{20}/cm^3$. The buried layers are then annealed and further oxidized. As shown, oxide will grow somewhat thicker over the n+ regions.

After formation of the n+ regions 14 and 16, the device is then masked as shown in FIG. 3b for simultaneous formation of the p+ channel stop 19 and the NMOS tub or well 12. The implant energy used in formation of the regions 19 and 12 is preferably between about 50 to 200 keV with a preferred range of 140 to 200 keV such that the dopant concentration of the p+ buried layers is between about $1 \times 10^{17}$ and $1 \times 10^{18}/cm^3$. The p+ regions preferably are doped with boron.

As shown in FIG. 3c, the channel stop mask and oxide are then removed and a doped n-type epitaxial silicon layer 21 having a thickness of, for example, about 1.1 μm is grown across the surface of the substrate. Next, a thin (for example about 250 Å) screen oxide layer is formed thereon, and a nitride layer is deposited to a thickness of, for example, about 1500 Å, although thinner layers, e.g. 750 Å may be preferable for some applications. In preferred embodiments, an oxide layer or other suitable mask for a silicon etch may then be deposited on nitride layer. The nitride layer and oxide layer thicknesses can be optimized based upon such factors as the oxide to silicon etch selectivities and the stress caused during isolation oxidation. After depositing sandwiched layers of thermal nitride and oxide, a photoresist mask is formed over the surface to define the field oxide regions 22a, 22b, 22c, and 22d.

The isolation oxide regions are formed using the well known "SWAMI" process according to one embodiment. The process may be modified by changing the silicon etch procedure and depth, and by choosing different oxide/nitride/oxide sidewall layers. In particular, according to one embodiment, the silicon is masked and etched to a depth of, e.g., about 3000 Å, preferably using a dry (e.g. plasma) etch as shown in FIG. 3d. The resist is then removed and a third thermal oxide layer (of about 400 Å), a second nitride layer (of about 600 Å), and a fourth deposited oxide layer (of about 1800 Å) are formed on the device. A second plasma etch is used to remove about 750 Å of additional silicon leaving the device substantially as shown in FIG. 3e. The remaining sidewall oxide is then removed and the substrate is then oxidized in a high pressure (e.g., 10 atmospheres) oxidation environment to grow the necessary isolation oxide, leaving the device as shown in FIG. 3f. The interface between the resulting isolation oxide and the active regions will preferably be between 85 and 90 degrees with respect to the horizontal plane. This steep angle results from the sharp etching characteristics of a dry etch used to form the structure depicted in FIG. 3d. A wet etch would result in a more sloped interface and a concomitant lower device packing density. Of course, some oxide may encroach into the active areas near the top of the interface as shown in FIG. 3f.

After the isolation oxide is formed, the nitride is stripped and a screen oxide layer having a thickness of about 250 Å is formed on the surface of the substrate as shown in FIG. 3g. A mask is then formed, exposing only the sink region 17. As shown in FIG. 3h, a sink implant using an implant energy of about 100 to 190 keV with a dose of between about $1 \times 10^{14}$ and $1 \times 10^{16}$ using phosphorus as a dopant is then performed. The resulting dopant concentration in the sink region 17 is between about $1 \times 10^{18}$ and $1 \times 10^{20}/cm^3$. The sink mask is then removed and a separate mask/ion implantation is performed to dope the well and channel regions of the PMOS transistor to a concentration of between about $1 \times 10^{16}$ and $5 \times 10^{16}/cm^3$ using phosphorus as a dopant, also as shown in FIG. 3h. In preferred embodiments, the implant energy used for the PMOS well region is between about 50 and 200 keV with energy of between about 100 and 200 keV preferred. The resulting net dopant concentration in the epitaxial channel region of the n-well is between about $1 \times 10^{16}$ and $5 \times 10^{16}/cm^3$. The sink and n-well are then annealed and driven-in by heating with a conventional thermal cycle in nitrogen.

Thereafter, a mask is formed on the surface of the substrate which exposes only the NMOS and PMOS transistor regions. This mask is used for a threshold voltage implant as shown in FIG. 3i. The implant is used to adjust the threshold voltage of the NMOS and PMOS transistors as necessary, typically to between about |0.6| and |1.0| volts. In preferred embodiments the threshold voltage implant is an implant of boron at a dose of between about $1 \times 10^{13}$ to $5 \times 10^{13}$ and preferably at 30 to 60 KeV. The boron and the up-diffusing p+ from the p-well set the threshold voltage for the NMOS transistor. The threshold voltage implant in conjunction with the n-well implant sets the PMOS threshold voltage. In preferred embodiments the threshold voltage implant ultimately provides transistors with threshold voltages of 0.75±0.1 for NMOS and −0.85±0.1 for PMOS transistors.

Referring to FIG. 3j, the screen oxide then is stripped and a thin (on the order of 135 to 165 Å) gate oxide layer 86 is grown using means well known to those of skill in the art. A thin (on the order of 400 to 600 Å) layer of polysilicon 88 is then deposited on the thin gate oxide layer and a mask 62 is formed on the poly layer to define the NMOS and PMOS gates. A plasma etch removes the undesired poly from all regions of the substrate except those over the NMOS and PMOS gate oxide regions. Next, a wet etch is used to remove the underlying oxide. Protection of the gate oxide by the thin poly layer provides MOS gates having far fewer defects since they are not exposed directly to photoresist.

Thereafter, a mask exposing part of the base region is formed on the surface of the substrate. As shown in FIG. 3k, this mask is used for a boron implantation which, after annealing, forms a more heavily doped region 23 at the intersection of the isolation oxide and the base region. As explained above, the higher dopant concentration at region 23 is used to control leakage currents along the intersection of the isolation oxide and intrinsic base. In alternative embodiments, the implant is performed earlier in the process (but after the isolation oxide is formed). Generally, however, this implant should be performed late in the fabrication, but before poly layer 64 is deposited, so that temperature increases associated with processing do not diffuse doped region 23.

The implant is made using boron or $BF_2$ at an energy of between about 20 and 60 KeV with a dose of about $10^{10}$ to $10^{15}$ with a preferred implant energy of about 25 KeV and a preferred dose of about $2 \times 10^{13}$. Subsequently, the boron implant is preferably annealed for about one to three hours at between about 600 and 1000 degrees Centigrade, and preferably for about two hours at 800 degrees Centigrade. Preferably, the implant and anneal are conducted such that the mask edge for this implant is only a few micrometers or less from the isolation oxide edge. In some embodiments, a screen oxide is provided over the base region during the implant. This can be accomplished by, for example, leaving screen oxide layer 86 in place over the base.

FIG. 3l illustrates the next sequence of process steps. The masks are removed and another layer of intrinsic polysilicon 64 having a thickness of about 1,000 to 4,000 and preferably about 3,200 Å is deposited across the entire surface of the substrate and a cap oxide layer 66 is formed by thermal oxidation of the polysilicon layer 64. The devices are then masked with photoresist to expose at least the base region of the bipolar transistor and the lightly doped regions of the resistors. In some embodiments, only the NMOS and PMOS transistor regions are protected by the mask. A base implant is performed as shown in FIG. 3m. The implant is subsequently annealed to diffuse P-type dopant from poly layer 64 BJT to form the intrinsic base region. In preferred embodiments the base implant uses an energy of between about 30 and 100 keV, with an implant energy of between about 30 and 50 keV preferred. The dose of this implant is preferably about $3 \times 10^{13}$ and $8 \times 10^{15}$. In preferred embodiments the anneal is performed by heating the structure to 900°–950° C. for 30–60 minutes, and results in a p– base region having a thickness of between about 1,000 and 2,000 Å with a dopant concentration of between about $1 \times 10^{18}$ and $1 \times 10^{19}/cm^3$, with a dopant concentration of about $5 \times 10^{18}/cm^3$ preferred.

As illustrated in FIG. 3n, a mask is formed which exposes regions 70a and 70d which will eventually be a portion of the resistor and the contact 32 (shown in FIG. 1a). In addition, the mask exposes regions where base contacts (not shown in FIG. 3, see 26 in FIG. 1a) will be formed. These regions are preferably doped p+ to a concentration of between about $1 \times 10^{19}$ and $1 \times 10^{20}/cm^3$ with a dopant concentration of about $6 \times 10^{19}/cm^3$ preferred using boron. The p+ mask is removed and another mask is formed on the surface of the device to expose regions 68a, 68b, and 68c which will eventually be used as the bipolar emitter contact, the bipolar collector contact, the source/drain contacts, and the gates of the MOS transistors. The regions 68 are doped n+ using an arsenic implant with an energy of about 100 keV to a concentration of between about $5 \times 10^{19}$ and $1 \times 10^{20}/cm^3$. As discussed above, the PMOS gate may be either n+ or p+ and thus may be included in either the n+ or p+ mask. A layer of nitride 67 having a thickness of between about 1,000 and 1,200 Å is then deposited for the purpose of preventing etch undercutting of the underlying polysilicon, and preventing the link implant from going into gates and emitters. The polysilicon layer 64 is then annealed at 900° C. for 15 minutes.

Next, a mask is formed on the surface of the nitride to protect the base, emitter, and collector contacts of the bipolar transistors and the source, gate, and drains of the NMOS and PMOS transistors. A dry etch with chlorine chemistry results in the structure shown in FIG. 3o. The etch is conducted such that the bipolar base and the epitaxial region adjacent the gates of the MOSFETs are etched below the original epitaxial surface by about 1,000 to 2,000 Å.

The next sequence of steps is illustrated in FIG. 3p. The etch mask is removed. A lightly doped drain (LDD) implant is performed in which the source and the drain of the NMOS transistor are lightly implanted with an n-type dopant such as phosphorus using an implant energy of between about 20 and 50 keV with implant energies of between about 20 and 40 keV preferred. This implant results in source and drain regions 72 which are self-aligned to the NMOS gate with a dopant concentration of about $5 \times 10^{17}$ and $1 \times 10^{19}/cm^3$. After an oxidation step to grow a cap oxide, a p-type LDD using a dopant such as $BF_2$ is performed across the surface of the bipolar transistor and the PMOS transistor with the source and drain of the PMOS transistor and the base region of the bipolar transistor exposed by a mask. A more heavily doped p-region (not shown) which is self-aligned to the emitter contact is formed in the base of the bipolar transistor and a more heavily doped p-region 76 which is self-aligned to the gate is formed around the gate of the PMOS transistor. The resulting net dopant concentration in the region 76 (and the more heavily doped p-region in the bipolar base) is between about $5 \times 10^{17}$ and $1 \times 10^{19}/cm^3$. The implant energy is preferably between about 40 and 60 keV. As shown, more heavily doped well ties are also diffused from the NMOS and PMOS contacts. Also, an emitter region 27b is diffused from the overlying emitter contact 27a and heavily doped extrinsic base regions are diffused from the base contact.

Referring now to FIG. 3q, nitride is stripped from the surface of the device and a Low Temperature Oxide (LTO) deposition is performed. A silicide exclusion mask, not shown, is formed on the device on polysilicon regions where silicide formation is not desired (e.g., over the center portion of the resistor). The oxide is then etched back, leaving spacer oxide on exposed sides of the source contacts, drain contacts, gates, emitter contacts, base contacts, and collector contacts using means known to those of skill in the art. The mask shown in FIG. 3q is then formed over the device for protection of at least the sidewall oxide on the bipolar emitter, the gates of the NMOS and PMOS transistors, and the resistor. The device is etched with BOE for about 1 minute and, as shown in FIG. 3r, the oxide is removed from the sidewall of the resistor/base contacts, the collector contacts, and the source and drain contacts of the NMOS and PMOS transistors. In alternative embodiments, sidewall oxide is selectively formed on the sidewall of polysilicon according to the process disclosed in U.S. application Ser. No. 07/503,491 (Attorney Docket No. 8332-232) which is incorporated herein by reference for all purposes.

Referring to FIG. 3s, a mask is formed and a heavy p+ (BF2) implant is performed in the regions shown therein, i.e., in the region of the source/drain of the PMOS transistor and the extrinsic base region of the bipolar transistor. The purpose of this implant is to further lower the resistances of the source/drain and extrinsic base regions. The implant uses an energy of between about 40 and 60 keV. Similarly, as shown in FIG. 3t, an n+ (arsenic) implant is performed in the region of the source/drain of the NMOS transistor for the purpose of forming the source/drain regions and lowering their resistances. The arsenic implant uses an energy of between about 50 and 100 keV. The device is then, optionally, annealed at a temperature of about 900° to 950° C. for about 10 to 30 minutes or at a temperature of 1000 to 1100° C. for about 10 to 30 seconds using a rapid thermal annealing process.

Next, a layer of refractory metal such as titanium, molybdenum, tantalum, tungsten, or the like, is deposited across the surface of the device. Using means well known to those of skill in the art, the layer is heated to form metal silicide in regions where the deposited metal is in contact with polysilicon. Remaining unreacted metal is then etched away from the device, leaving a structure as shown in FIG. 3u. As shown therein, the silicide contact 48 of the emitter extends across the horizontal upper surface of the emitter contact from one sidewall oxide to the opposite sidewall oxide. The bipolar polysilicon base contacts (not shown) are covered with silicide across their horizontal upper surfaces, and along their vertical sidewalls. In addition, the silicide contacts extend from the vertical sidewalls along the horizontal upper surface of the single-crystal base fully up to the sidewall oxide of the emitter. The silicide 80 on the collector contact 20 extends up both vertical sidewalls of the collector contact and fully across the horizontal upper surface of the contact, terminating on the field oxide regions 22b and 22c. The silicide 54a on the NMOS polysilicon contact 28 extends from the field oxide region 22c, up the vertical sidewall of the contact, across its upper surface, and down the vertical portion of the contact to the single-crystal source region of the NMOS transistor. Additionally, the silicide extends from the contact across the horizontal upper portion of the source/drain regions to the gate sidewall oxide. Like the bipolar emitter, the polysilicon gate of the NMOS transistor includes silicide 50 across its upper surface which extends from one oxide sidewall to the opposite sidewall oxide.

The polysilicon well tap 32 also is covered with silicide which covers both the vertical sidewalls and horizontal upper surface of the contact. Additionally, the silicide extends across the upper surface of the transistors up to the sidewall oxide of the transistor gates. The PMOS gate includes silicide 52 across its horizontal upper surface, while the PMOS source contact includes silicide 54c across its horizontal upper surface, its vertical sidewall, and across the horizontal surface of the drain up to the gate sidewall oxide.

The contact scheme disclosed herein provides reduced source/drain resistance through silicidation of the sidewall polysilicon contact strap, thereby increasing the current drive capability of the CMOS transistors and eliminating the polysilicon-silicon contact resistance. Reduced polysilicon source/drain to the epitaxial silicon source/drain overlap is obtained by removing the sidewall spacer oxide and silicidation of this sidewall, since the current will be carried through this sidewall silicide and not through the epitaxial silicon-polysilicon interface. This provides for a higher packing density through smaller CMOS transistor active areas.

Removal of the spacer sidewall oxide and silicidation of the extrinsic base polysilicon sidewall will lower the extrinsic base resistance, thus eliminating the problem with the high polysilicon-silicon contact resistance, which enhances the bipolar transistor electrical characteristics. The bipolar transistor geometry is reduced by siliciding the sidewall extrinsic base poly and through reduction of the base polysilicon to the epitaxial silicon base overlap; consequently, a lower extrinsic base junction capacitance is obtained in conjunction with a lower extrinsic base resistance. Also, the reduction in the bipolar transistor active area due to the sidewall silicidation also reduces the collector-substrate junction capacitance, thereby enhancing the transistor electrical characteristics. Still further, siliciding of the collector sidewall poly for contacting the silicided polysilicon to the silicided silicon collector will reduce the collector resistance by eliminating the polysilicon to silicon contact resistance. This lower resistance will allow for scaling of the collector area, and thus a reduction in the collector-substrate capacitance and an increase in the packing density.

It is believed that sidewall silicidation of the local interconnects improves the resistance of the interconnect by a factor of 2, thereby enhancing the circuit performance. Silicided polysilicon according to the invention herein, as applied to a ground tap, would reduce the ground tap resistance by conducting the current through the silicided sidewall poly tap to the substrate rather than the doped polysilicon to the substrate.

FIG. 3v illustrates the next step in the fabrication sequence in which oxide layer 56 is deposited and masked to form contact holes therein. Metal is deposited on the surface of the device, masked, and etched from selected regions, providing the device shown in FIG. 3w. In alternative embodiments the contact holes are filled with tungsten and etched back so as to form a planar surface before deposition of the metal interconnect layer. Thereafter, additional metallization layers are formed and the device is passivated.

III. Device Performance

Several wafers were prepared according to an embodiment of this invention. Various implant conditions were used to form the diffusion compensation regions 23. In addition some control wafers were prepared without implanting a diffusion compensation region. CEO current-voltage characteristics of the wafers were measured at three positions and plotted for double-sided base (DB), single-sided base (SB), ECL DB output transistors, 20 ECL DB arrays, and 4$k$ SB arrays.

Figure 4A:
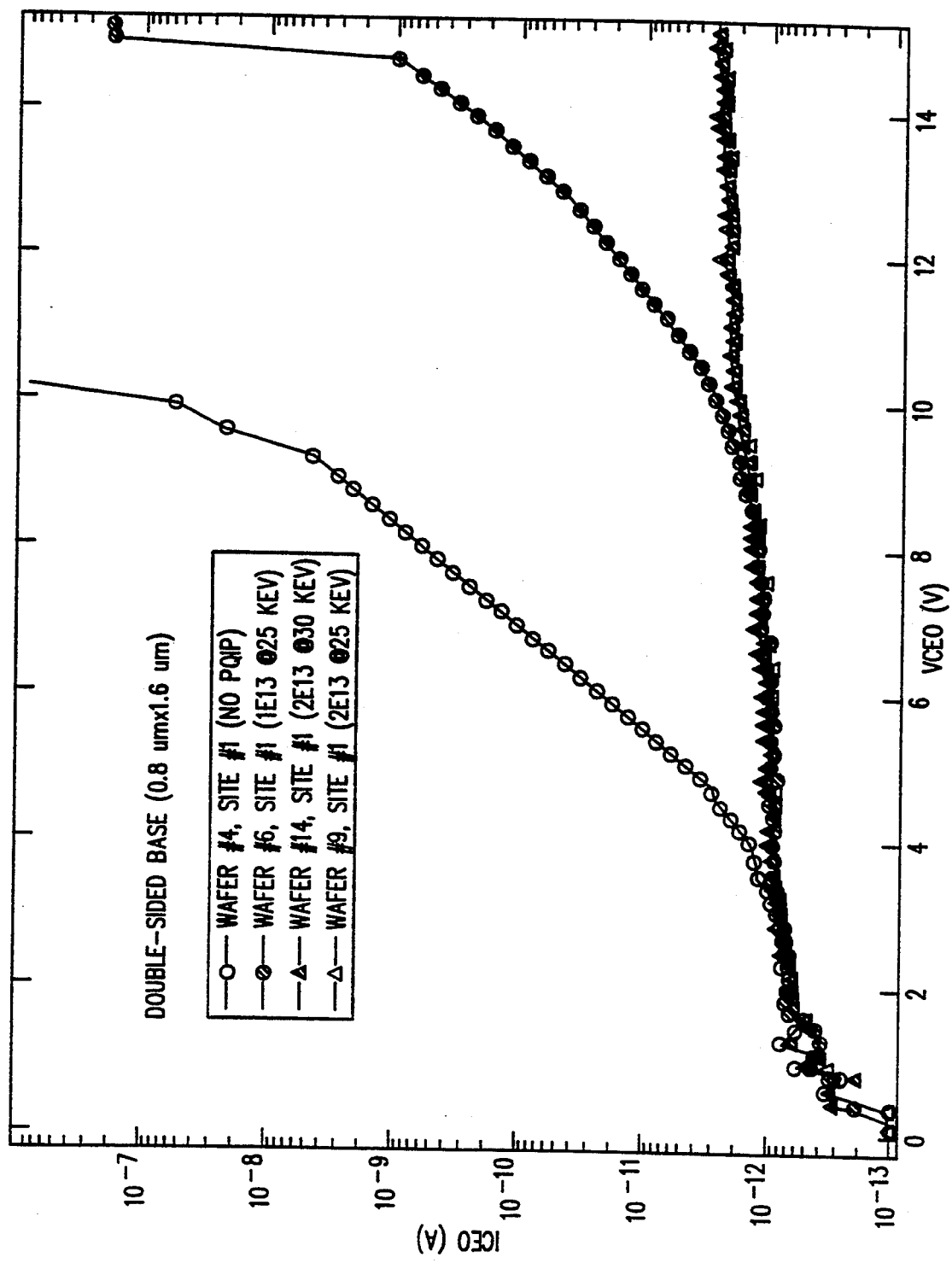
FIGS. 4a to 4e are plots of CEO voltage-current characteristics of wafers prepared according to an embodiment of this invention.
Figure 4B:
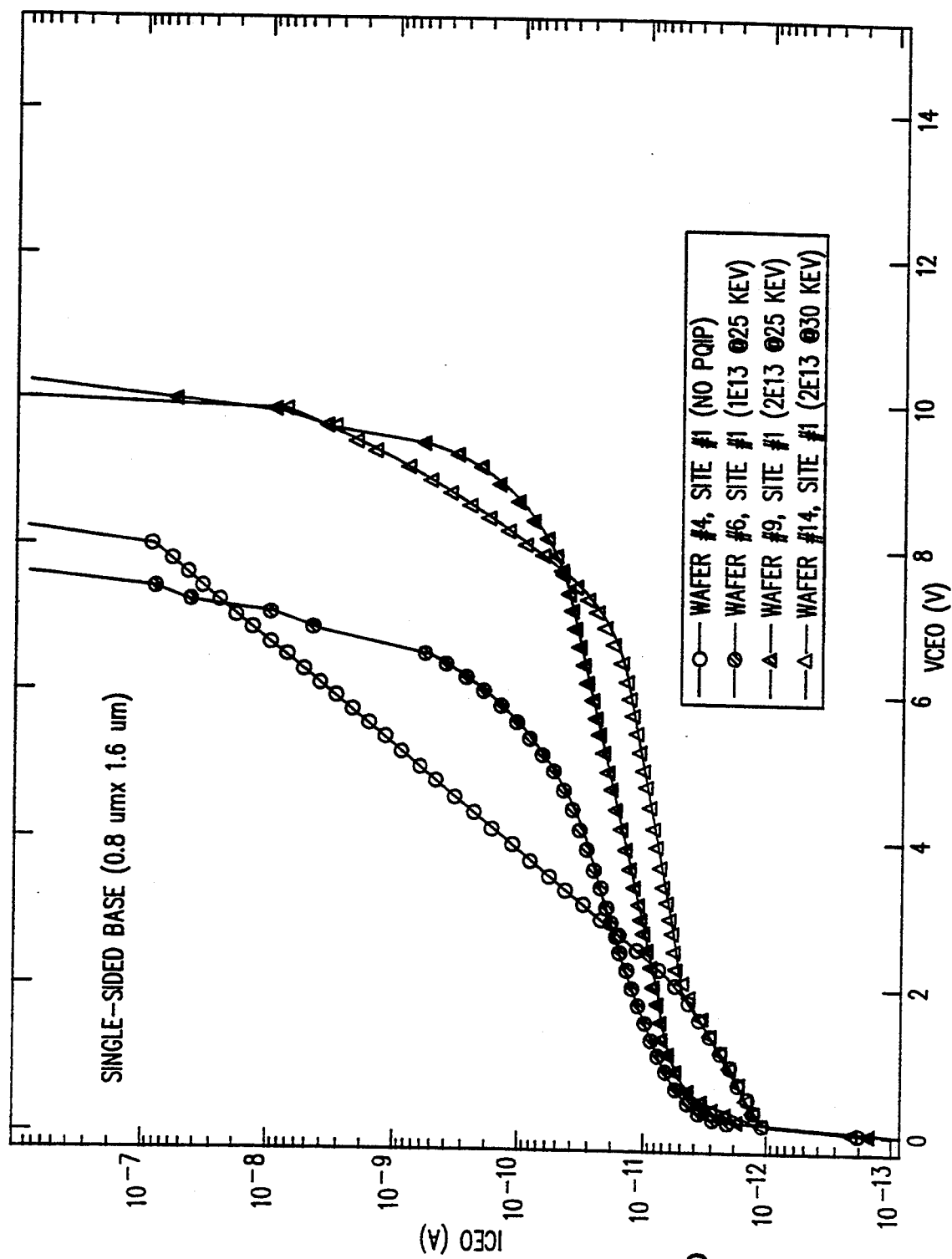
Figure 4C:
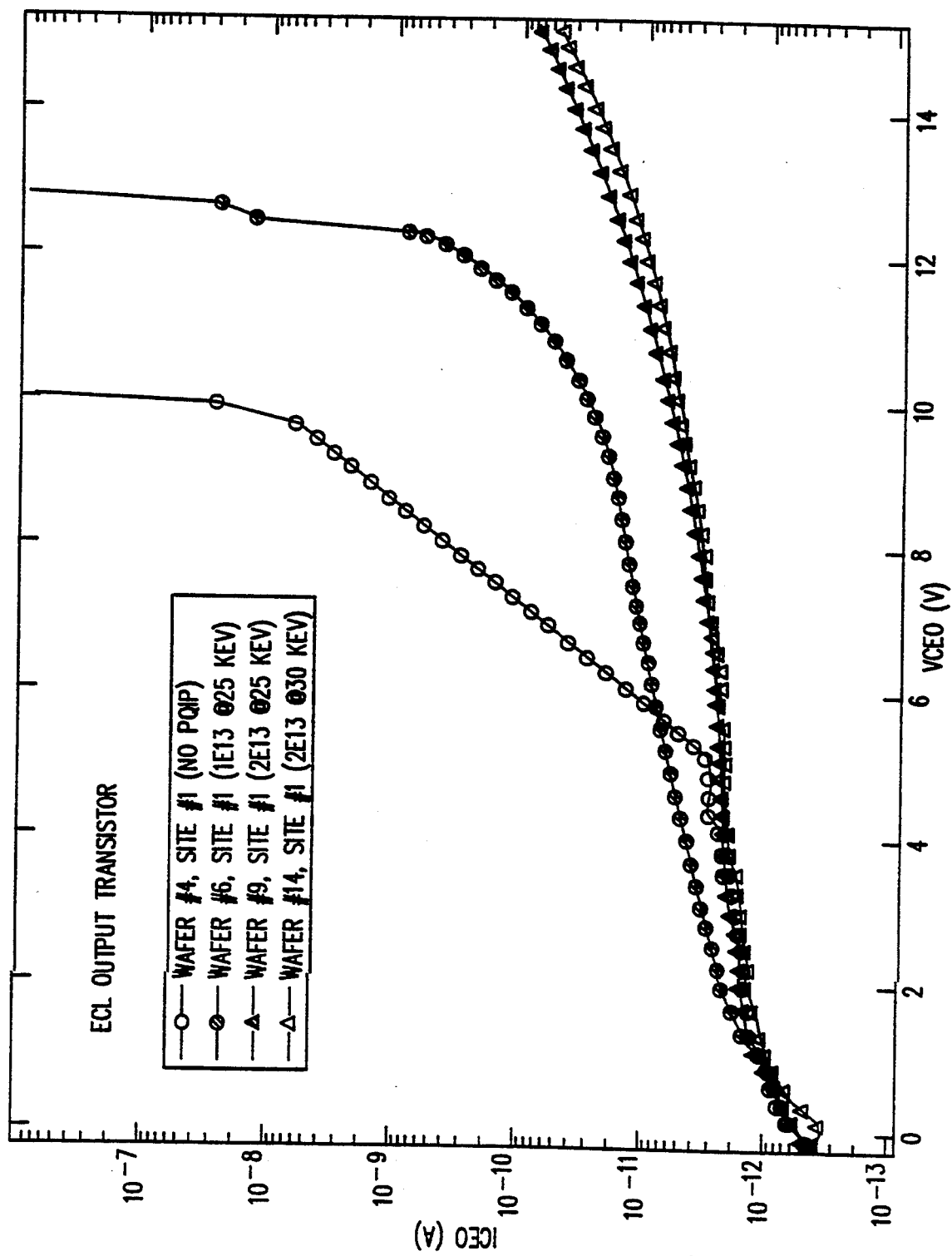
Figure 4D:
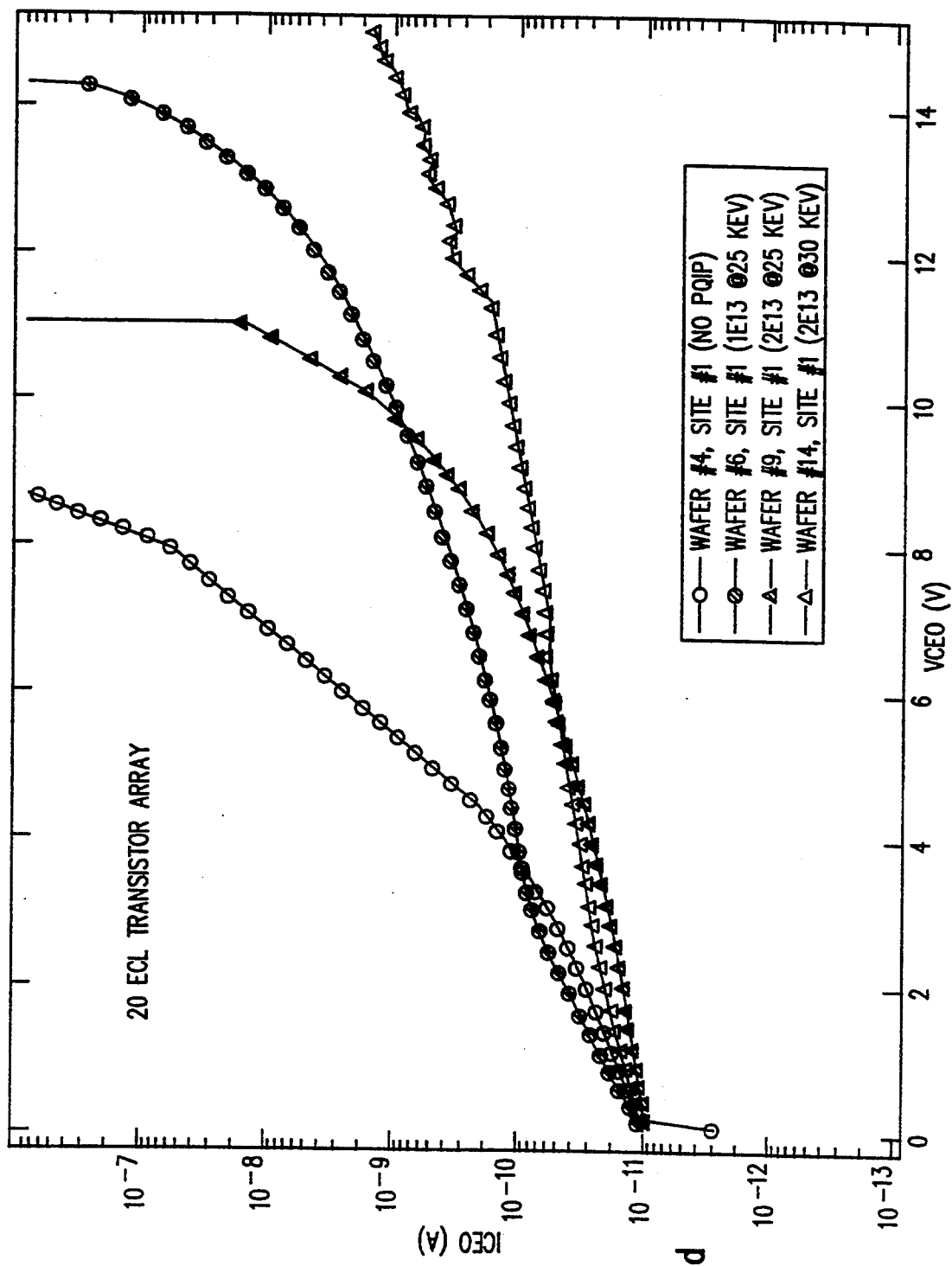
Figure 4E:
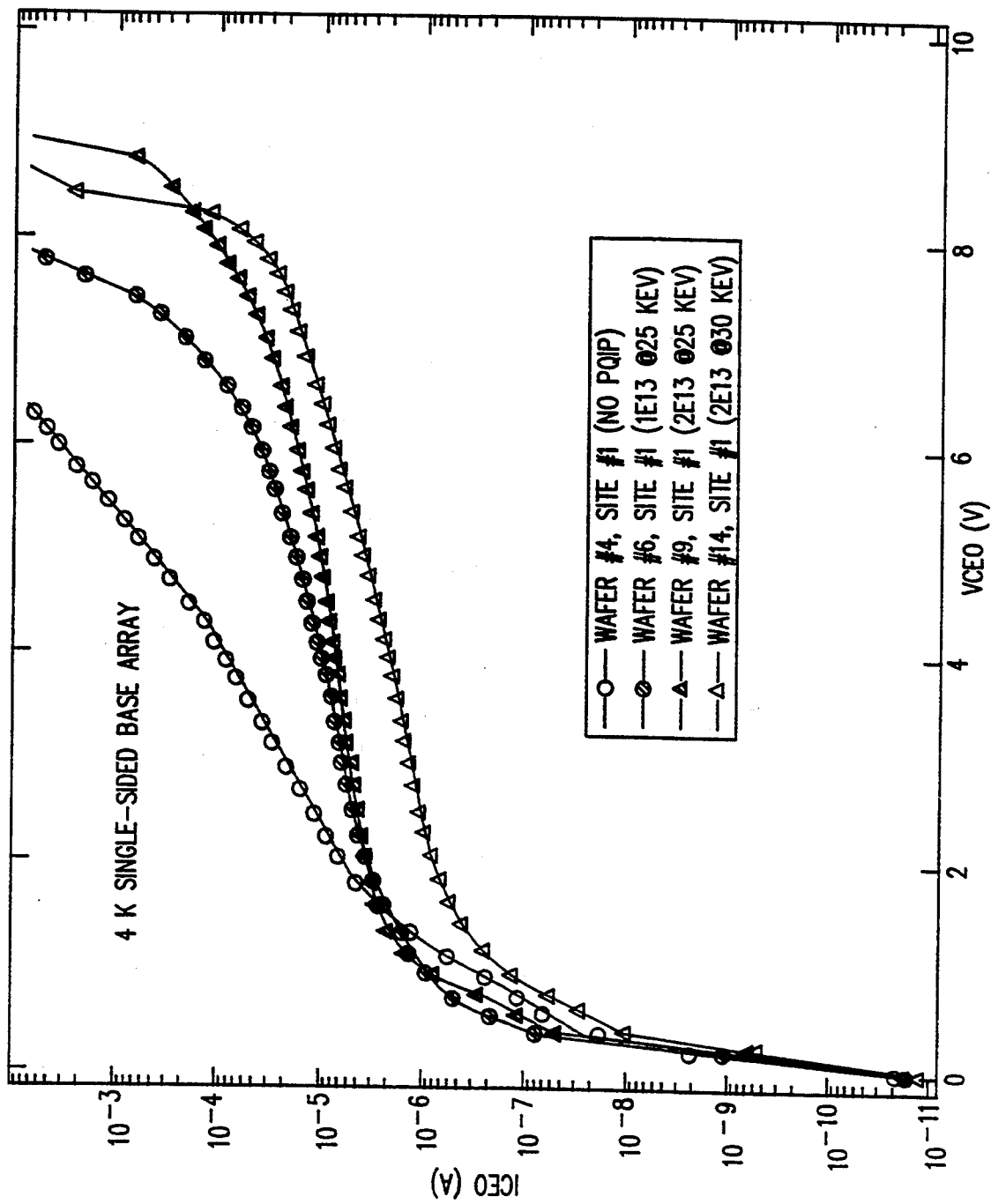

FIGS. 4a to 4e show CEO current-voltage characteristics for a 0.8 × 1.6 micrometer double-sided base (FIG. 4a), a 0.8 × 1.6 micrometer single-sided base (FIG. 4b), an ECL output transistor (FIG. 4c), a 20 ECL transistor array (FIG. 4d), and a 4$k$ single-sided base array (FIG. 4e). In each figure, the open circles indicate wafers without a diffusion compensation implant, the closed circles indicate a wafer with an implant dose of $10^{13}$ at an energy of 25 KeV, the closed triangles indicate a wafer with an implant dose of $2 \times 10^{13}$ at an energy of 25 KeV, and the open triangles indicate a wafer with an implant dose of $2 \times 10^{13}$ at an energy of 30 KeV. For each wafer, the implant was annealed at 800 degrees Centigrade for two hours.

As shown in the plots, the CEO voltage-current characteristics improved with larger doses and higher energies. By optimizing both beta (gain) and $BV_{CEO}$, it was determined that preferred implant conditions were a dose of $2 \times 10^{13}$ at an energy of 25 KeV.

IV. Conclusion

It is to be understood that the above description is intended to be illustrative and not restrictive. Many variations of the invention will become apparent to those of skill in the art upon review of this disclosure. Although the invention has been illustrated with regard to specific dopant concentrations in some instances, it should also be clear that a wide range of dopant concentrations may be used for many features of the devices herein without departing from the scope of the inventions herein. Further, although the invention was illustrated with regard to a BiCMOS device, other structures containing bipolar devices could likewise be produced. The scope of the invention should, therefore be determined not with reference to the above description, but instead should be determined with reference to the appended claims along with their full scope of equivalents.

What is claimed is:

1. A method of fabricating a BiCMOS structure, the method comprising the following steps:
   a) defining an active area of a bipolar transistor and an active area of a MOS device;
   b) forming an isolation oxide around the active areas, the bipolar transistor active area and the isolation oxide having an intersection region;
   c) defining an emitter contact region over bipolar transistor active area and portions of the isolation oxide, the emitter contact region overlying the intersection region;
   d) forming an oxide layer over a portion of the active region of the MOS device and the intersection region, said oxide layer portion over the MOS device active region defining a gate oxide layer;
   e) forming a mask over the bipolar transistor active area, the mask exposing the oxide layer at the intersection region underlying the emitter contact region; and f) implanting dopants of the first conductivity type into the exposed segments of the oxide layer at the intersection region.

2. The method recited in claim 1 further comprising the following steps:

a) depositing a layer of poly over the bipolar transistor active area and the active region of the MOS device; and b) patterning the poly layer to form an emitter contact over the bipolar transistor active area and source and drain contacts adjacent the gate oxide of the MOS device.

3. The method of claim 2 further comprising the steps of:

implanting the layer of poly over the bipolar transistor active area; and diffusing the implant from the poly layer into the active area to form an emitter region.

4. The method recited in claim 1 further comprising a step of annealing the implanted dopants.

5. The method recited in claim 1 wherein the dopants of the first conductivity type are p-type dopants.

6. The method recited in claim 5 wherein the p-type dopant is boron.

7. The method recited in claim 1 wherein the step of implanting the dopants is conducted with $BF_2$ at about 30 KeV.

8. The method of claim 1 wherein the step of implanting the dopants is conducted with $BF_2$ between 20 and 60 KeV at doses of between $1 \times 10^{10}$ and $1 \times 10^{15}$ atoms/cm$^2$.

9. The method of claim 1 wherein said exposed oxide layer at the intersection region defines a window to localize the first conductivity type dopants introduced by the subsequent implanting step to the intersection region without substantially extending into the bipolar active area.

10. The method of claim 9 wherein said window includes edges which extends less than 0.2 μm into the bipolar active region.

* * * * *